US010355062B2

United States Patent
Yu

(10) Patent No.: US 10,355,062 B2
(45) Date of Patent: Jul. 16, 2019

(54) ORGANIC LIGHT EMITTING DISPLAY

(71) Applicant: LG Display Co., Ltd., Seoul (KR)

(72) Inventor: Jaesung Yu, Seoul (KR)

(73) Assignee: LG Display Co., Ltd., Seoul (KR)

( * ) Notice: Subject to any disclaimer, the term of this patent is extended or adjusted under 35 U.S.C. 154(b) by 164 days.

(21) Appl. No.: 15/678,920

(22) Filed: Aug. 16, 2017

(65) Prior Publication Data

US 2018/0061915 A1    Mar. 1, 2018

(30) Foreign Application Priority Data

Aug. 31, 2016  (KR) .......................... 10-2016-0111797

(51) Int. Cl.
| | | |
|---|---|---|
| *H01L 27/32* | (2006.01) | |
| *G09G 3/3258* | (2016.01) | |
| *H01L 51/52* | (2006.01) | |
| *G09G 3/3233* | (2016.01) | |

(52) U.S. Cl.
CPC ....... *H01L 27/3248* (2013.01); *G09G 3/3258* (2013.01); *H01L 27/3262* (2013.01); *H01L 27/3265* (2013.01); *H01L 27/3276* (2013.01); *H01L 51/5203* (2013.01); *G09G 3/3233* (2013.01); *G09G 2300/0852* (2013.01); *G09G 2310/0262* (2013.01); *G09G 2320/045* (2013.01)

(58) Field of Classification Search
CPC ....................................................... H01L 27/32
See application file for complete search history.

(56) References Cited

U.S. PATENT DOCUMENTS

| | | | | |
|---|---|---|---|---|
| 2015/0035734 A1* | 2/2015 | Lee | ...................... | G09G 3/3258 345/76 |
| 2016/0189635 A1* | 6/2016 | Lee | ...................... | G09G 3/3233 345/690 |

* cited by examiner

*Primary Examiner* — Marvin Payen
(74) *Attorney, Agent, or Firm* — Polsinelli PC

(57) ABSTRACT

An organic light emitting display is disclosed. In the disclosure, only one switching TFT among TFTs constituting a pixel is implemented as an NMOS type TFT, and at least some of a driving TFT and the remaining switching TFTs are implemented as a PMOS type TFT. Therefore, the disclosure simplifies TFT process steps and provides an organic light emitting display suitable for realizing a high resolution pixel implementation.

16 Claims, 13 Drawing Sheets

○ : ON switching
✕ : OFF switching

ORGANIC LIGHT EMITTING DISPLAY

CROSS-REFERENCE TO RELATED APPLICATION

This application claims the priority of Korean Patent Application No. 10-2016-0111797 filed in the Republic of Korea on Aug. 31, 2016, which is hereby incorporated by reference in its entirety.

BACKGROUND

Field of the Disclosure

The present disclosure relates to a display device, and more particularly, to an organic light emitting display. Although the present disclosure has a wide scope of applications, it is particularly suitable for simplifying a TFT process and realizing a high resolution pixel implementation in the organic light emitting display.

Description of the Background

An active matrix organic light emitting display includes organic light emitting diodes (OLEDs) capable of emitting light by themselves and has many advantages, such as a fast response time, a high emission efficiency, a high luminance, a wide viewing angle, and the like.

An OLED serving as a self-emitting element, as shown in FIG. 1, includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When a power voltage is applied to the anode electrode and the cathode electrode, holes passing through the hole transport layer HTL and electrons passing through the electron transport layer ETL move to the emission layer EML and form excitons. As a result, the emission layer EML generates visible light.

An organic light emitting display arranges pixels each including an OLED in a matrix form and adjusts a luminance of the pixels based on a gray scale of video data. Each pixel includes a driving thin film transistor (TFT) controlling a driving current flowing in the OLED based on a gate-source voltage of the driving TFT, and at least one switching TFT programming the gate-source voltage of the driving TFT. Each pixel adjusts the display gray scale (luminance) by an amount of emitted light of the OLED which is proportional to the driving current.

In such an electroluminescent display, there is known a technique of a low refresh of pixels in order to reduce power consumption when a change in an input video is small. Since a refresh period of the video data is lengthened at a time of the low refresh, the video data charged in the pixels cannot be maintained at a target level and leak. In order to minimize the leakage of such video data, in the conventional low refresh technology, some of the TFTs of the pixels are formed of oxide TFTs having good off-current characteristics, and the remaining TFTs other than the oxide TFTs in the pixels are formed of a low temperature polysilicon (LTPS) TFT. Thus, in general, the TFT connected to a gate electrode of the driving TFT is formed of an oxide TFT, and the remaining TFTs are formed of the LTPS TFT.

FIG. 2 is a one-pixel circuit including an oxide TFT and an LTPS TFT according to the related art. FIG. 3 is a driving waveform of FIG. 2. Referring to FIGS. 2 and 3, the pixel PXL includes an organic light emitting diode (OLED), a plurality of thin film transistors (ST1 to ST3, DT), and two capacitors Cst1 and Cst2. In FIG. 2, "Coled" represents a parasitic capacitance of the OLED.

The TFTs ST1 to ST3 and DT are implemented as n-type MOSFETs (hereinafter, referred to as NMOS). For the low refresh, a first switching TFT ST1 is formed of an NMOS type oxide TFT having good off-current characteristics. The remaining TFTs ST2, ST3, and DT are formed of NMOS type LTPS TFTs having good response characteristics.

The pixel PXL is driven through a scanning period and an emission period Te. The scanning period may be set to approximately one horizontal period 1H and include an initialization period Ti, a sampling period Ts, and a programming period Tw.

During the initialization period Ti, a predetermined reference voltage Vref is applied to a data line DL. During the initialization period Ti, a voltage of a gate node Ng is initialized to the reference voltage Vref, and a voltage of a source node Ns is initialized to a predetermined initializing voltage Vinit.

During the sampling period Ts, while a potential of the gate node Ng is maintained at the reference voltage Vref, a potential of the source node Ns is raised by a drain-source current Ids, According to such a source-follower method, a gate-source voltage Vgs of the driving TFT DT is sampled as a threshold voltage Vth of the driving TFT DT, and the sampled threshold voltage Vth is stored in a first capacitor Cst1. At an end of the sampling period Ts, the voltage of the gate node Ng becomes the reference voltage Vref and the voltage of the source node Ns becomes a voltage equal to the difference between the reference voltage Vref and the threshold voltage Vth.

During the programming period Tw, a data voltage Vdata is applied to the gate node Ng, and a voltage distribution result between the capacitors Cst1 and Cst2 with respect to a voltage change Vdata-Vref of the gate node Ng is reflected to the source node Ns, and thereby the gate-source voltage Vgs of the driving TFT DT corresponding to a desired driving current is programmed.

During the light emission period Te, according to the driving current, the OLED is emitted to realize the luminance corresponding to the video data.

The above-described pixel circuit for a low refresh has the following problems.

First, in an instance of forming the TFT as an NMOS type, a process step for forming a lightly doped drain (LDD) structure must be added. The LDD structure is a structure for preventing a strong electric field effect from occurring at an N+ interface under the poly silicon in the NMOS type, and this requires an additional mask process.

Second, in an instance of a pixel for a low refresh, since the data voltage and the reference voltage are alternately supplied through the data line, the number of transitions of a source driver that drives the data line increases. Therefore, there is a limit in reducing power consumption.

SUMMARY

Accordingly, the present disclosure is to provide an organic light emitting display that simplifies TFT process steps and is suitable for realizing a high resolution pixel implementation by implementing TFTs constituting a pixel as an oxide TFT and an LTPS TFT, and implementing some of the TFTs as an NMOS type TFT and the remaining TFTs as a PMOS type TFT.

In addition, the present disclosure is to provide an organic light emitting display that can minimize a problem of a luminance increase in black gray scale level caused when a TFT is implemented as a PMOS type.

In order to solve the above described problems, there is provided an organic light emitting display having an organic light emitting element includes a driving TFT configured to apply a driving current to the organic light emitting element to emit the organic light emitting element, a plurality of switching TFTs involved in turn-on of the driving TFT, and a first capacitor connected to a gate electrode of the driving TFT and storing a turn-on voltage of the driving TFT. One TFT is implemented as an NMOS type TFT among the switching TFTs, and remaining TFTs and the driving TFTs are implemented as a PMOS type TFT or a combination of the PMOS type TFT and the NMOS type TFT.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
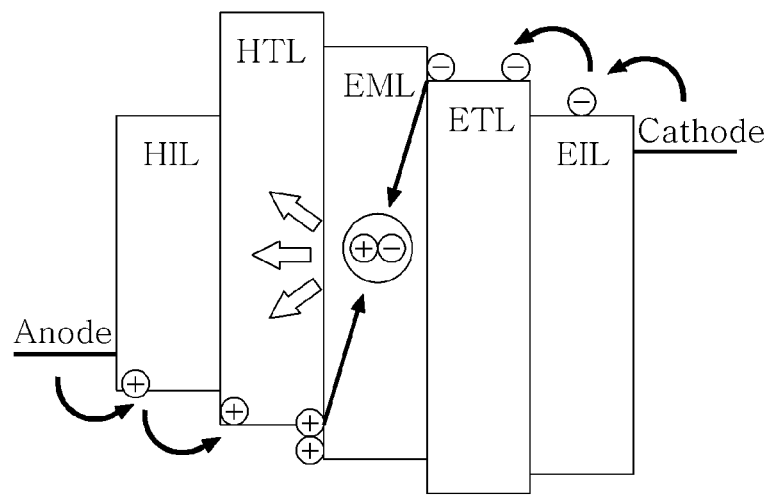
FIG. 1 is a diagram illustrating a general OLED structure.
Figure 2:
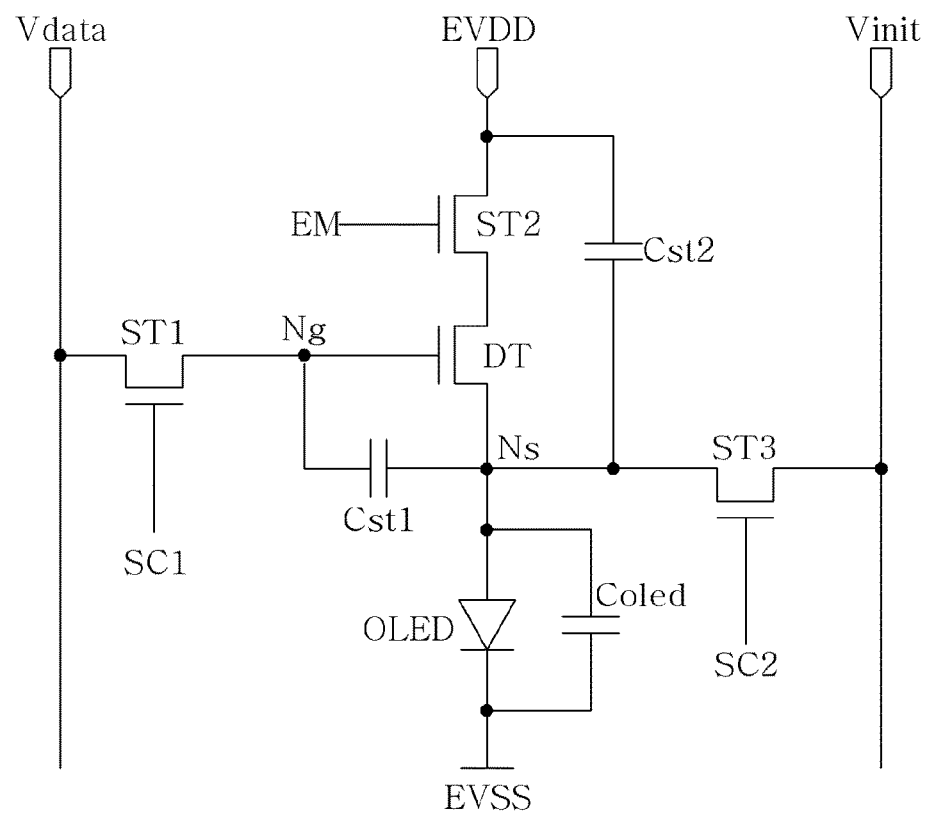
FIG. 2 is a one-pixel circuit including an oxide TFT and an LTPS TFT according to the related art.
Figure 3:
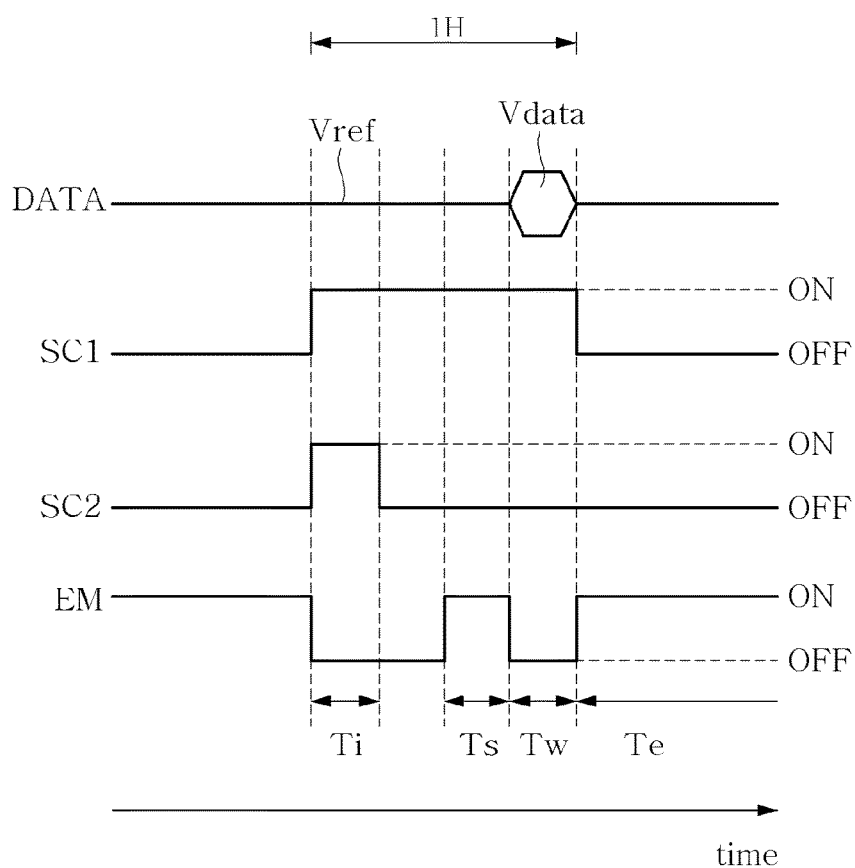
FIG. 3 is a driving waveform of FIG. 2.

Advantages and features of the present disclosure and methods for accomplishing the same will become apparent with reference to the aspects described in detail below with reference to the accompanying drawings. However, the present disclosure is not limited to aspects disclosed below, and may be implemented in various forms. These aspects are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing aspects of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the disclosure, the detailed description thereof will be omitted. In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component without departing from the scope of the present disclosure.

Like reference numerals designate like elements throughout the description.

The features of various aspects of the present disclosure can be partially combined or entirely combined with each other, and can be technically interlocking-driven in various ways. The aspects can be independently implemented, or can be implemented in conjunction with each other.

Various aspects of the present disclosure will be described in detail below with reference to the accompanying drawings. The component names used in the following description are selected in consideration of easiness of specification, and may be different from the parts names of actual products.

Figure 4:
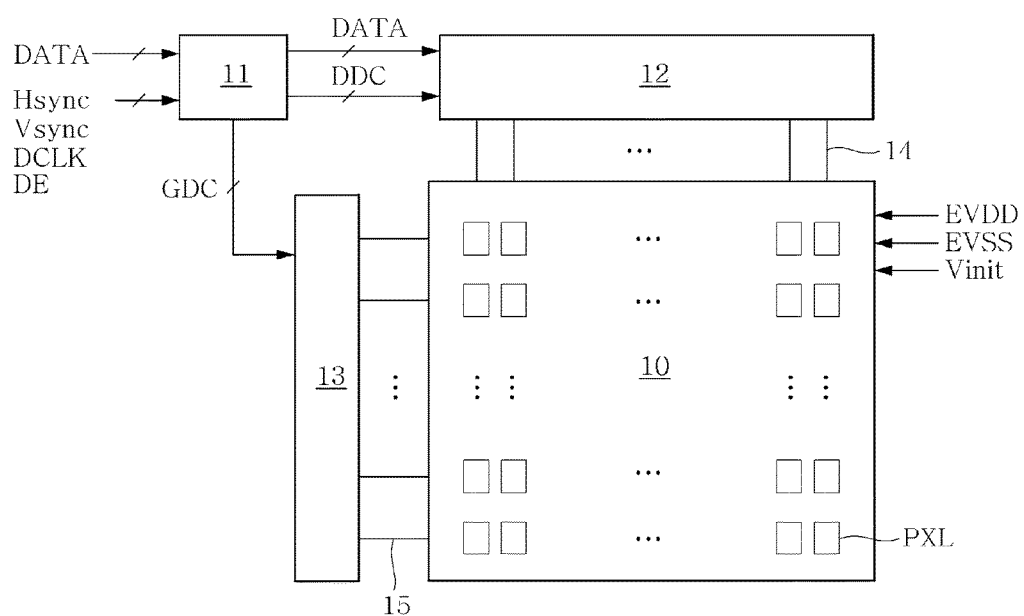
FIG. 4 is a block diagram illustrating an organic light emitting display according to an aspect of the disclosure.
Figure 5:
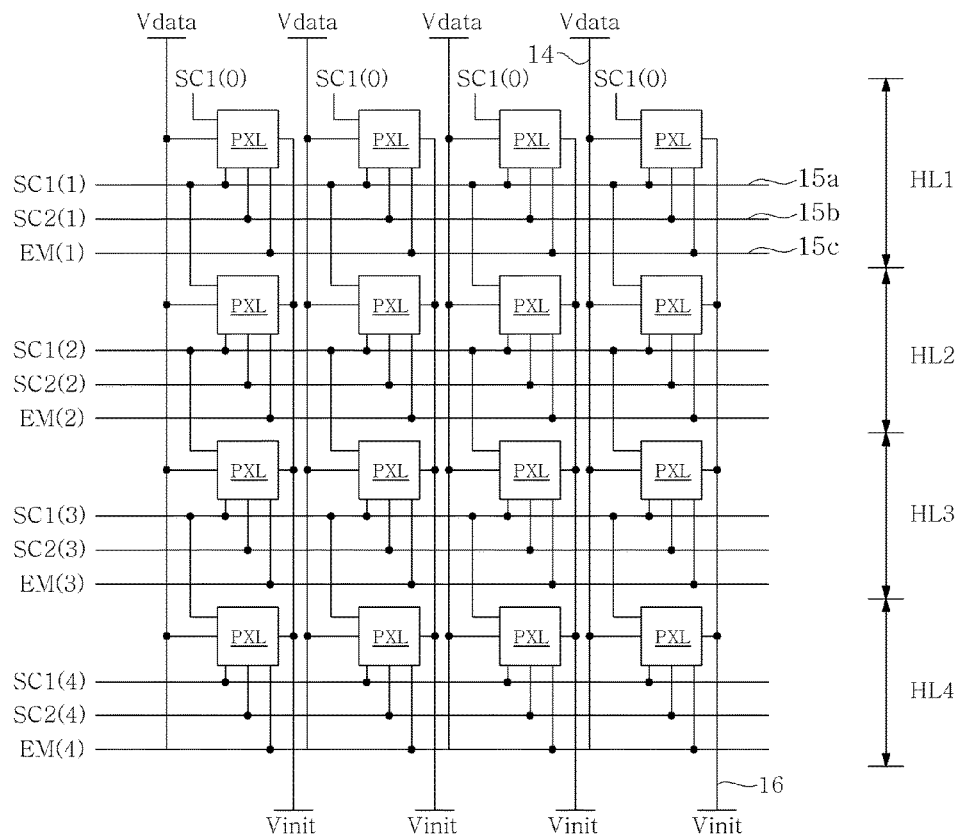
FIG. 5 illustrates a pixel array according to an aspect of the disclosure.

FIG. 4 illustrates an organic light emitting display according to an aspect of the disclosure. FIG. 5 illustrates a pixel array according to an aspect of the disclosure.

Referring to FIGS. 4 and 5, the organic light emitting display according an aspect of the disclosure includes a display panel 10 having a plurality of pixels PXL, display panel driving circuits 12 and 13 driving signal lines connected to each of the pixels PXL, and a timing controller 11 controlling the display panel driving circuits.

The display panel driving circuits 12 and 13 write data DATA of an input image to the pixels PXL of the display panel 10. The display panel driving circuits 12 and 13 include a source driver 12 driving data lines 14 connected to the pixels PXL and a gate driver 13 driving gate lines 15 connected to the pixels PXL.

The display panel driving circuits 12 and 13 may operate in a low refresh mode. In the low refresh mode, when an input image is analyzed and the input image does not change by a preset number of frames, that is, when a still image is input for a predetermined time or longer, a driving frequency for operating the display panel driving circuits 12 and 13 is lowered and an image data writing period for the pixels PXL is controlled to be extended to reduce power consumption. A refresh rate at which the image data DATA is updated on the display panel 10 in the low refresh mode is slower than in a basic driving mode. In other words, when a driving frequency is M Hz in the basic driving mode, a driving frequency in the low refresh mode is lower than M Hz. The low refresh mode is not limited to when a still image is input. For example, when a display device operates in a standby mode or a user command or an input image is not input to the display panel driving circuits 12 and 13 for a predetermined time or more, the display panel driving circuits 12 and 13 may operate in the low refresh mode.

In the display panel 10, a plurality of data lines 14 and a plurality of gate lines 15 cross each other, and the pixels PXL are arranged in a matrix form. The pixel array of the display panel 10 is provided with a plurality of horizontal pixel lines HL1 to HL4. On each of the horizontal pixel lines HL1 to HL4, a plurality of pixels PXL which are horizontally adjacent and connected in common to the gate lines 15 are arranged. The pixel array may further include an initialization voltage supply line 16 for supplying an initialization voltage Vinit to the pixels PXL, an EVDD supply line for supplying a high potential driving voltage EVDD to the pixels PXL, and an EVSS supply line for supplying a low potential driving voltage EVSS to the pixels PXL.

The gate lines 15 include a first gate line 15a to which a first scan signal SC1 is supplied, a second gate line 15b to which a second scan signal SC2 is supplied, and a third gate line 15c to which an emission signal EM is supplied. A first scan signal SC1(n), a second scan signal SC2(n) and an emission signal EM(n) allocated to an n-th horizontal pixel line are supplied to pixels PXL arranged in the n-th horizontal pixel line. A first scan signal SC1 (n−1) allocated to an (n−1)th horizontal pixel line may be further supplied to the pixels PXL arranged in the n-th horizontal pixel line. To this end, pixels PXL arranged in a first horizontal pixel line HL1 are commonly connected to a first gate line 15a to which a first scan signal SC1(1) is supplied, a second gate line 15b to which a second scan signal SC2(1) is supplied, and a third gate line 15c to which an emission signal EM(1) is supplied, and further connected in common to a first gate line (not shown) of a zero-th horizontal pixel line (not shown) to which a first scan signal SC1(0) is supplied. Similarly, pixels PXL arranged in a fourth horizontal pixel line HL4 are commonly connected to a first gate line 15a to which a first scan signal SC1(4) is supplied, a second gate line 15b to which a second scan signal SC2(4) is supplied, and a third gate line 15c to which an emission signal EM(4) is supplied, and further connected in common to a first gate line 15a of a third horizontal pixel line HL3 to which a first scan signal SC1(3) is supplied.

Each of the pixels PXL may be one of a red sub-pixel, a green sub-pixel, a blue sub-pixel, and a white sub-pixel for color implementation. Each of the pixels PXL may be connected to one data line 14, one initialization voltage supply line 16, one first gate line 15a, one second gate line 15b, one third gate line 15c, an EVDD supply line, an EVSS supply line, and the like.

The source driver 12 converts data DATA of the input image received from the timing controller 11 every frame in the basic driving mode into a data voltage Vdata, and supplies the data voltage Vdata to the data lines 14. The source driver 12 outputs the data voltage Vdata using a digital to analog converter (hereinafter, referred to as DAC) that converts the data DATA of the input image into a gamma compensation voltage. A driving frequency of the source driver 12 is lowered under a control of the timing controller 11 in the low refresh mode. For example, the source driver 12 outputs the data voltage Vdata of the input image in one frame period in the basic driving mode. However, the source driver 12 outputs the data voltage Vdata of the input image in several frame periods in the low refresh mode and may be idle in some frames (i.e., the output of the data voltage Vdata may be blocked). Therefore, the driving frequency and power consumption of the source driver 12 in the low refresh mode are significantly lower than those in the basic driving mode.

A multiplexer (not shown) may be further disposed between the source driver 12 and the data lines 14 of the display panel 10. The multiplexer can reduce the number of output channels of the source driver 12 compared to the number of data lines by distributing the data voltages output through one output channel in the source driver 12 to the plurality of data lines. The multiplexer can be omitted depending on resolution and uses of the display device.

The source driver 12 may generate and supply the initialization voltage Vinit to the initialization voltage supply line 16, generate and supply the high potential driving voltage EVDD to the EVDD supply line, and generate and supply the low potential driving voltage EVSS to the EVSS supply line. To this end, the source driver 12 may further include a power generator (not shown). The power generator may be electrically connected to the source driver via a conductive film or the like after being mounted outside the source driver 12. The initialization voltage Vinit may be selected to be a voltage lower than the low potential driving voltage EVSS so that unnecessary light emission of an OLED is prevented during an initialization period.

The gate driver 13 outputs the scan signals SC 1 and SC 2 under the control of the timing controller 11 to select the pixels PXL to be charged with the data voltage. The gate driver 13 is implemented as a shift register and can sequentially supply the first scan signal SC1 to the first gate lines 15a by shifting the first scan signal SC1. The gate driver 13 is implemented as a shift register and can sequentially supply the second scan signal SC2 to the second gate lines 15b by shifting the second scan signal SC2.

The gate driver 13 outputs the emission signal EM under the control of the timing controller 11 to control an emission timing of the pixels PXL to which the data voltage is charged. The gate driver 13 includes the shift register and an inverter, and can sequentially supply the signals to the third gate lines 15c by shifting the emission signal EM.

The gate driver 13 may be formed directly on a substrate of the display panel 10 together with the pixel array in a gate-driver in panel (GIP) process, but is not limited thereto. The gate driver 13 may be manufactured in an IC type and then bonded to the display panel 10 by a conductive film.

The timing controller 11 receives digital data DATA of an input image from a host system (not shown) and timing signals synchronized with the digital data DATA. The timing signals include a vertical synchronization signal Vsync, a horizontal synchronization signal Hsync, a dot clock signal DCLK, and a data enable signal DE. The host system may be one of a television (TV) system, a set-top box, a navigation system, a DVD player, a Blu-ray player, a personal computer (PC), a home theater system, and a phone system.

The timing controller 11 includes a low refresh control module for varying a driving frequency of the display panel driving circuits 12 and 13. It should be noted that the low refresh mode as described above is not limited to still images.

The timing controller 11 multiplies an input frame frequency by i in the basic driving mode and can control operation timings of the display panel driving circuits 12 and 13 at a frame frequency of the input frame frequency×i (where i is a positive integer larger than 0) Hz. The input frame frequency is 60 Hz set by the National Television Standards Committee (NTSC) system and 50 Hz set by the phase-alternating line (PAL) system. The timing controller 11 lowers the driving frequency of the display panel driving circuits 12 and 13 in the low refresh mode. For example, the timing controller 11 may lower the driving frequency of the display panel driving circuits 12 and 13 to 1 Hz so that a writing period of the image data DATA for the pixels PXL is one second. The frequency of the low refresh mode is not limited to 1 Hz. The pixels of the display panel 10 can maintain an already charged data voltage without charging a new data voltage for most of one frame in the low refresh mode.

The timing controller 11 generates a data timing control signal DDC for controlling the operation timing of the source driver 12 and a gate timing control signal GDC for controlling the operation timing of the gate driver 13 based on the timing signals Vsync, Hsync, and DE received from the host system. The timing controller 11 may generate the timing control signals DDC and GDC differently in the basic driving mode and the low refresh mode.

The data timing control signal DDC includes a source start pulse, a source sampling clock, and a source output enable signal. The source start pulse controls a sampling start timing of the source driver 12. The source sampling clock is a clock for shifting a data sampling timing. When a signal transfer interface between the timing controller 11 and the source driver 12 is a mini Low Voltage Differential Signaling (LVDS) interface, the source start pulse and the source sampling clock may be omitted.

The gate timing control signal GDC includes a gate start pulse, a gate shift clock, an emission shift clock, a gate output enable signal, etc. In an instance of the GIP circuit, the gate output enable signal may be omitted. The gate start pulse is generated at a beginning of the frame period every frame period and input to the shift register of each gate driver 13. The gate start pulse controls a start timing at which the scan signals SC1 and SC2 and the emission signal EM are output every frame period. The gate shift clock is input to the shift register of the gate driver 13 to control a shift timing of the shift register. The emission shift clock is input to the inverter of the gate driver 13 to control a shift timing of the inverter.

Figure 6:
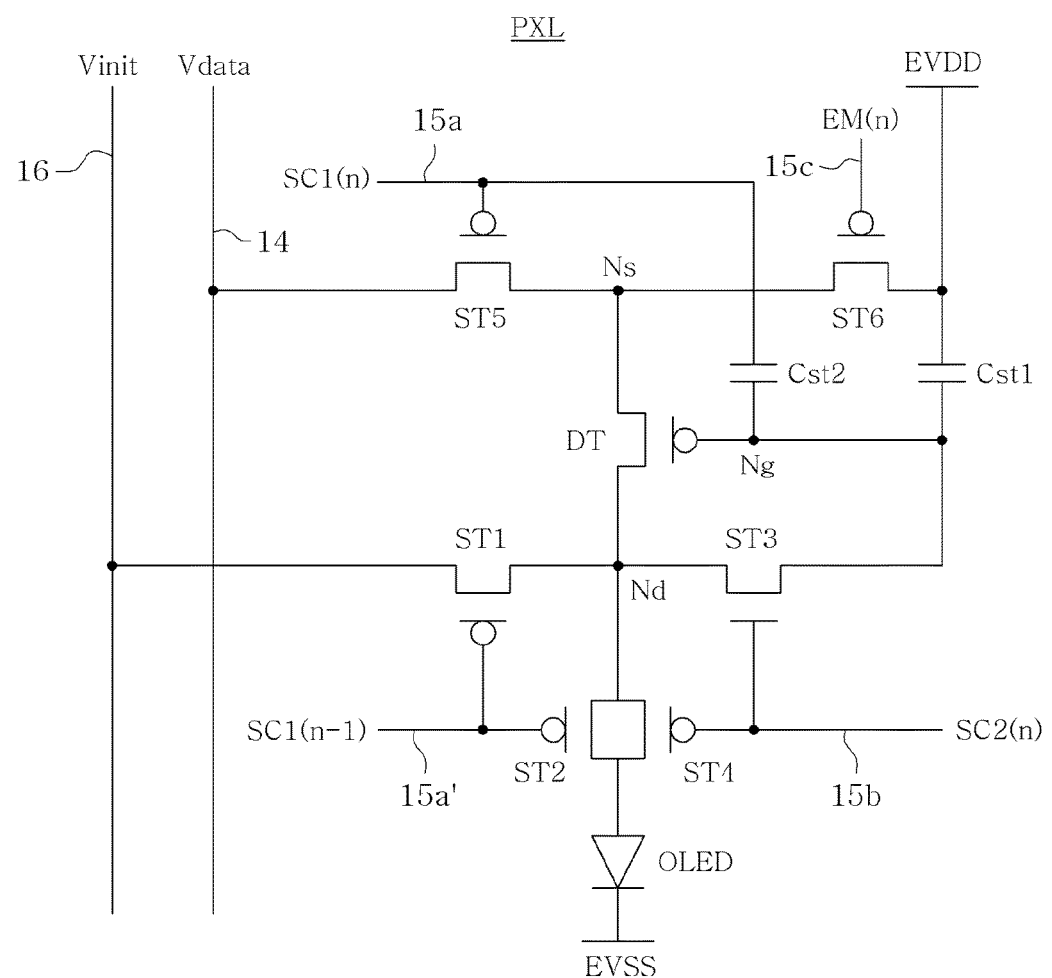
FIG. 6 illustrates a connection configuration of a pixel shown in FIG. 5.
Figure 7:
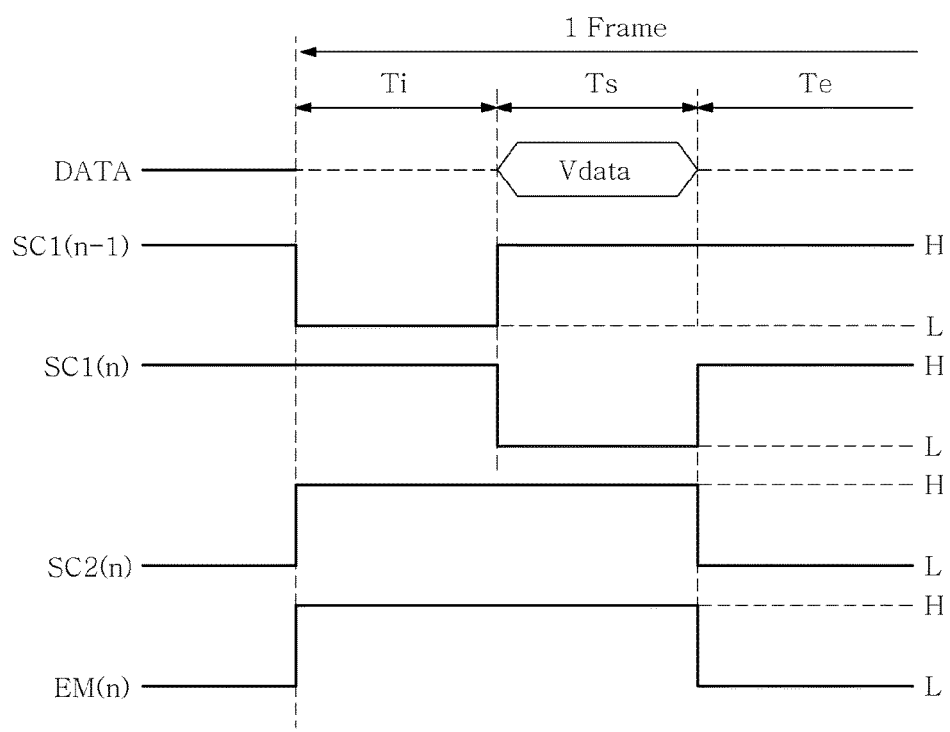
FIG. 7 illustrates driving signals input to a pixel shown in FIG. 5.

FIG. 6 illustrates a connection configuration of a pixel PXL shown in FIG. 5 and FIG. 7 illustrates driving signals input to a pixel PXL shown in FIG. 5.

Referring to FIGS. 6 and 7, each of the pixels PXL of the disclosure includes an organic light emitting diode (OLED), a plurality of thin film transistors (TFTs) ST1 to ST6, DT, and two capacitors Cst1 and Cst2.

In the pixels PXL of the disclosure, a third switching TFT ST3 may be implemented as an oxide TFT having good off-current characteristics. When the third switching TFT ST3 is implemented as the oxide TFT, variation of a potential of a gate node Ng due to a leakage current in a low refresh mode can be suppressed as much as possible. In other words, when the third switching TFT ST3 is implemented as the oxide TFT, reduction of a charging voltage of the pixel PXL due to the leakage current can be minimized in the low refresh mode.

In the pixels PXL of the disclosure, the remaining TFTs DT, ST1 to ST2, and ST4 to ST6 may be implemented as LTPS TFTs, thereby ensuring desired response characteristics.

In the pixels PXL of the disclosure, at least one of the switching TFTs may be implemented as an NMOS type oxide TFT, and the remaining TFTs may be implemented as a PMOS type LTPS TFT. In an aspect of the disclosure, the third switching TFT ST3 implemented as the oxide TFT is described as an NMOS type, and the remaining switching TFTs ST1, ST2, and ST4 to ST6 implemented as the LTPS TFT are all described as a PMOS type. However, the present disclosure is not limited thereto. The present disclosure can be applied to designing the remaining switching TFTs ST1, ST2, ST4 to ST6 implemented as the LTPS TFTs as a hybrid type in which the PMOS type and the NMOS type are mixed. In other words, the third switching TFT ST3 is implemented as an NMOS type TFT, and the remaining TFTs DT, ST1 to ST2, and ST4 to ST6 except that the third switching TFT ST3 may be implemented as a PMOS type TFT or a combination of the PMOS type TFT and the NMOS type TFT. That is, the third switching TFT ST3 is implemented as the NMOS type oxide TFT, and the remaining TFTs DT, ST1 to ST2, and ST4 to ST6 are implemented as the PMOS type LTPS TFT or a combination of the PMOS type LTPS TFT and an NMOS type LTPS TFT.

When at least one switching TFT ST1, ST2, ST4 to ST6 implemented as the LTPS TFT is designed as a PMOS type as in the disclosure, TFT process steps can be simplified. In the PMOS type TFT, unlike the NMOS type TFT, there is no need to generate a lightly doped drain (LDD) structure through an additional mask process. This is because, in an instance of the PMOS type LTPS TFT, the majority of the carriers are holes, and the holes have a lower mobility than the electrons, so that the leakage of current does not occur at an N+ interface without the LDD structure. Therefore, in the PMOS type TFT, there is no need to add a mask process for forming the LDD structure, so that the process steps can be simplified correspondingly.

Hereinafter, a connection configuration of each pixel PXL arranged on an n-th horizontal pixel line will be described in detail.

The OLED emits light with an amount of a current adjusted depending on a gate-source voltage of a driving TFT DT. A cathode electrode of the OLED is connected to an input terminal of a low potential driving voltage EVSS through an EVSS supply line. The OLED includes an organic compound layer formed between an anode electrode and the cathode electrode. The organic compound layer may include a hole injection layer (HIL), a hole transport layer (HTL), an emission layer (EML), an electron transport layer (ETL), and an electron injection layer (EIL). However, the organic compound layer is not limited thereto.

The driving TFT DT is a driving element for adjusting a current flowing in the OLED depending on the gate-source voltage Vgs. When the driving TFT DT is implemented as the PMOS type LTPS TFT, the amount of the current of the OLED can be increased to increase efficiency and improve power consumption. The driving TFT DT includes a gate electrode connected to the gate node Ng, a drain electrode connected to a drain node Nd, and a source electrode connected to a source node Ns.

A first switching TFT ST1 is a switching element that forms a current path between an initialization voltage supply line 16 and the drain node Nd depending on a previous first scan signal SC1($n$–1) input to an (n–1) th horizontal pixel line. The first switching TFT ST1 may be implemented as the PMOS type LTPS TFT. A gate electrode of the first switching TFT ST1 is connected to a previous first gate line 15$a$' to which the previous first scan signal SC1($n$–1) is applied, a source electrode of the first switching TFT ST1 is connected to the initialization voltage supply line 16, and a drain electrode of the first switching TFT ST1 is connected to the drain node Nd. The first switching TFT ST1 is turned on only during an initialization period Ti, and maintains a turn-off state during a sampling period Ts and an emission period Te.

A second switching TFT ST2 is a switching element that forms a current path between the drain node Nd and the anode electrode of the OLED depending on the previous first scan signal SC1(n−1) input to the (n−1) th horizontal pixel line. The second switching TFT ST2 may be implemented as the PMOS type LTPS TFT. A gate electrode of the second switching TFT ST2 is connected to the previous first gate line 15a' to which the previous first scan signal SC1(n−1) is applied, a source electrode of the second switching TFT ST2 is connected to the drain node Nd, and a drain electrode of the second switching TFT ST2 is connected to the anode electrode of the OLED. The second switching TFT ST2 is turned on only during the initialization period Ti, and maintains the turn-off state during the sampling period Ts and the emission period Te.

A third switching TFT ST3 is a switching element that forms a current path between the gate node Ng and the drain node Nd depending on a current second scan signal SC2(n) input to an n-th horizontal pixel line. The third switching TFT ST3 may be implemented as the NMOS type oxide TFT. A gate electrode of the third switching TFT ST3 is connected to a current second gate line 15b to which the current second scan signal SC2(n) is applied, a source electrode of the third switching TFT ST3 is connected to the gate node Ng, and a drain electrode of the third switching TFT ST3 is connected to the drain node Nd. The third switching TFT ST3 is turned on in the initialization period Ti and the sampling period Ts, and maintains the turn-off state in the emission period Te.

A fourth switching TFT ST4 is a switching element that forms a current path between the drain node Nd and the anode electrode of the OLED depending on the current second scan signal SC2(n) input to the n-th horizontal pixel line. The fourth switching TFT ST4 may be implemented as the PMOS type LTPS TFT. A gate electrode of the fourth switching TFT ST4 is connected to the current second gate line 15b to which the current second scan signal SC2(n) is applied, a source electrode of the fourth switching TFT ST4 is connected to the drain node Nd, and a drain electrode of the fourth switching TFT ST4 is connected to the anode electrode of the OLED. The fourth switching TFT ST4 is turned off in the initialization period Ti and the sampling period Ts, and maintains a turn-on state in the emission period Te.

A fifth switching TFT ST5 is a switching element that forms a current path between a data line 14 and the source node Ns depending on a current first scan signal SC1(n) input to the n-th horizontal pixel line. The fifth switching TFT ST5 may be implemented as the PMOS type LTPS TFT. A gate electrode of the fifth switching TFT ST5 is connected to a current first gate line 15a to which the current first scan signal SC1(n) is applied, a source electrode of the fifth switching TFT ST5 is connected to the data line 14, and a drain electrode of the fifth switching TFT ST5 is connected to the source node Ns. The fifth switching TFT ST5 is turned off in the initialization period Ti and the emission period Te, and remains the turn-on state in the sampling period Ts.

A sixth switching TFT ST6 is a switching element that forms a current path between an input terminal of a high potential driving voltage EVDD and the source node Ns depending on a current emission signal EM(n) input to the n-th horizontal pixel line. The sixth switching TFT ST6 may be implemented as the PMOS type LTPS TFT. A gate electrode of the sixth switching TFT ST6 is connected to a current third gate line 15c to which the current emission signal EM(n) is applied, a source electrode of the sixth switching TFT ST6 is connected to the input terminal of the high potential driving voltage EVDD through an EVDD supply line, and a drain electrode of the sixth switching TFT ST6 is connected to the source node Ns. The sixth switching TFT ST6 is turned off in the initialization period Ti and the sampling period Ts, and maintains the turn-on state in the emission period Te.

A first capacitor Cst1 is connected between the gate node Ng and the input terminal of the high potential driving voltage EVDD to maintain the gate-source voltage Vgs of the driving TFT DT.

Each pixel PXL arranged on the n-th horizontal pixel line further includes a second capacitor Cst2 connected between the current first gate line 15a and the gate node Ng.

The second capacitor Cst2 minimizes a potential change of the gate node Ng when the third switching TFT ST3 is turned off at a start time of the emission period Te. Since the gate node Ng and the current second gate line 15b are coupled through a parasitic capacitor, when the current second scan signal SC2(n) is falling to a low level L to turn off the third switching TFT ST3 at the start time of the emission period Te, a potential of the gate node Ng may also drop due to an effect of kick back. At this time, the gate node Ng is further coupled to the current first gate line 15a using the second capacitor Cst2, when the current first scan signal SC1(n) is applied to the current first gate line 15a at a high level H, the effect of kick back on the gate node Ng is suppressed. When the effect of kick back on the gate node Ng is suppressed, it is possible to minimize a problem of a luminance increase in black gray scale level caused when the LTPS TFT is implemented as the PMOS type. This will be described later with reference to FIG. 11.

Each pixel PXL arranged on the n-th horizontal pixel line can be driven through the initialization period Ti, the sampling period Ts after the initialization period Ti, and the emission period Te after the sampling period Ts.

In the initialization period Ti, the previous first scan signal SC1(n−1) is input at the low level L and the current first scan signal SC1(n), the current second scan signal SC2(n), and the current emission signal EM(n) are input at the high level H. In the sampling period Ts, the current first scan signal SC1(n) is input at the low level L, and the previous first scan signal SC1(n−1), the current second scan signal SC2(n), and the current emission signal EM(n) are input at the high level H. In the emission period Te, the previous first scan signal SC1(n−1) and the current first scan signal SC1(n) are input at the high level H, and the current second scan signal SC2(n) and the current emission signal EM(n) are input at the low level L. Here, the high level H is a voltage level for turning on the NMOS type oxide TFT and a voltage level for turning off the PMOS type LTPS TFT. The low level L is a voltage level for turning off the NMOS type oxide TFT and a voltage level for turning on the PMOS type LTPS TFT.

Figure 8:
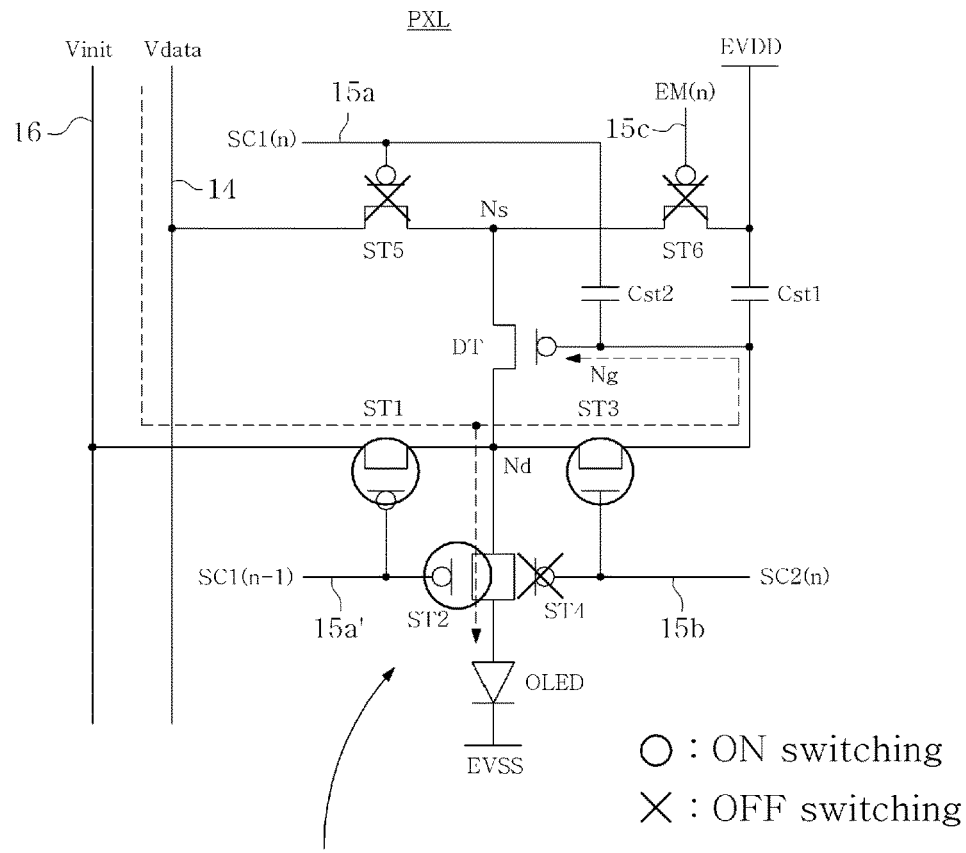
FIG. 8 is an equivalent circuit diagram illustrating an operation state of a pixel during an initialization period of FIG. 7.
Figure 8:
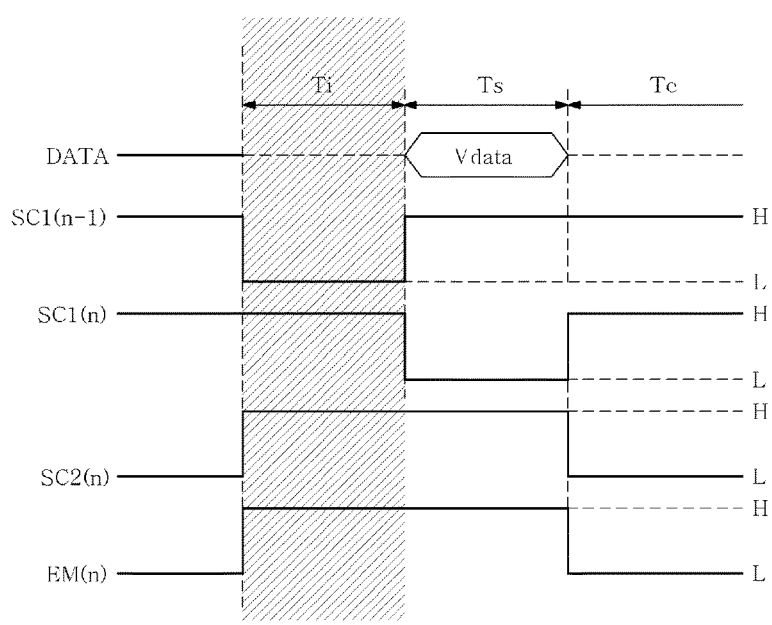
Figure 9:
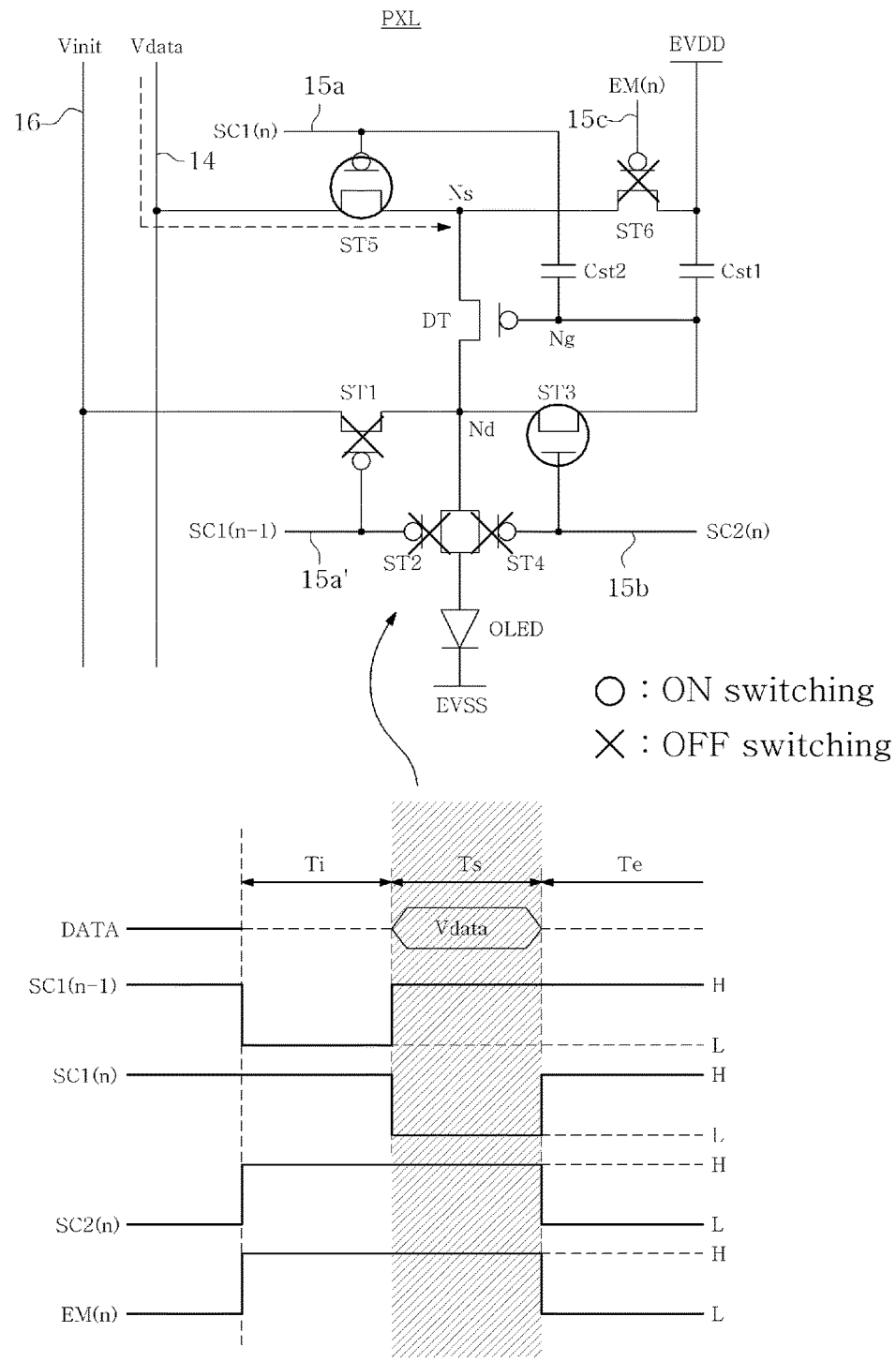
FIG. 9 is an equivalent circuit diagram illustrating an operation state of a pixel during a sampling period of FIG. 7.
Figure 10:
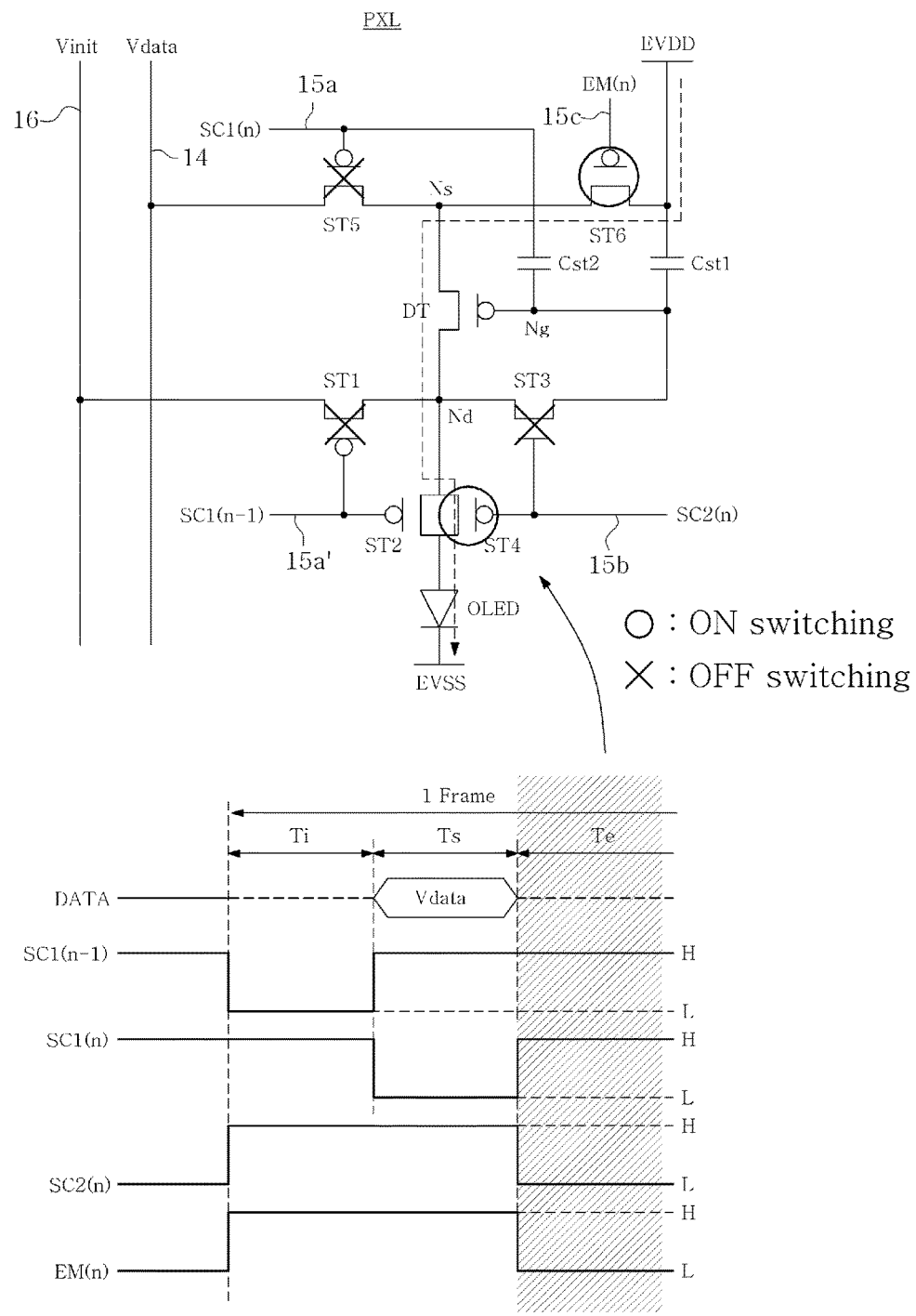
FIG. 10 is an equivalent circuit diagram illustrating an operation state of a pixel during an emission period of FIG. 7.

FIGS. 8 to 10 are equivalent circuit diagrams illustrating an operation state of a pixel PXL during an initialization period Ti, a sampling period Ts, and an emission period Te of FIG. 7, respectively.

Referring to FIG. 8, in the initialization period Ti, the previous first scan signal SC1(n−1) is input at the low level L to turn on the first and second switching TFTs ST1 and ST2, and the current second scan signal SC2(n) is input at the high level H to turn on the third switching TFT ST3 and turn off the fourth switching TFT ST4. In the initialization period Ti, the current first scan signal SC1(n) is input at the high level H to turn off the fifth switching TFT ST5. In the initialization period Ti, the current emission signal EM(n) is input at the high level H to turn off the sixth switching TFT ST6.

As a result, in the initialization period Ti, the gate node Ng, the drain node Nd, and the anode electrode of the OLED are initialized to the initialization voltage Vinit.

Referring to FIG. 9, in the sampling period Ts, the previous first scan signal SC1(n−1) is input at the high level H to turn off the first and second switching TFTs ST1 and ST2, and the current second scan signal SC2(n) is input at the high level H to turn on the third switching TFT ST3 and turn off the fourth switching TFT ST4. In the sampling period Ts, the current first scan signal SC1(n) is input at the low level L to turn on the fifth switching TFT ST5. In the sampling period Ts, the current emission signal EM(n) is input at the high level H to turn off the sixth switching TFT ST6.

As a result, in the sampling period Ts, the data voltage Vdata is applied to the source node Ns from the data line 14, and the gate node Ng and the drain node Nd are short-circuited and the driving TFT DT is diode-connected. "Vdata-Vth" is sampled and stored in the first capacitor Cst1 due to the diode connection of the driving TFT DT. Specifically, when the data voltage Vdata higher than the initialization voltage Vinit is applied to the source node Ns in a state in which the driving TFT DT is diode-connected, a current flows in the driving TFT DT (since the gate-source voltage of the driving TFT DT is "Vdata-Vinit", which is larger than a threshold voltage Vth of the driving TFT DT, the driving TFT DT is turned on and a current flows). Due to this current, a potential of the gate node Ng and the drain node Nd rises from the initializing voltage Vinit to "Vdata−Vth". When the potential of the gate node Ng and the drain node Nd becomes "Vdata−Vth", the gate-source voltage of the driving TFT DT becomes the threshold voltage Vth of the driving TFT DT, and the driving TFT DT is turned off. At the time when the driving TFT DT is turned off, the potential of the gate node Ng becomes "Vdata-Vth" and is applied to one electrode of the first capacitor Cst1.

Referring to FIG. 10, in the emission period Te, the previous first scan signal SC1(n−1) is input at the high level H to turn off the first and second switching TFTs ST1 and ST2, and the current second scan signal SC2(n) is input at the low level L to turn off the third switching TFT ST3 and turn on the fourth switching TFT ST4. In the emission period Te, the current first scan signal SC1(n) is input at the high level H to turn off the fifth switching TFT ST5. In the emission period Te, the current emission signal EM(n) is input at the low level L to turn on the sixth switching TFT ST6.

As a result, a current path connecting the input terminal of the high potential driving voltage EVDD, the driving TFT DT, the OLED, the input terminal of the low potential driving voltage EVSS is formed. A driving current corresponding to the gate-source voltage Vgs set in the sampling period Ts flows in the driving TFT DT. This driving current is independent of the threshold voltage Vth of the driving TFT DT and has a value proportional to a square root of "EVDD-Vdata".

More specifically, the driving current Ids flowing in the driving TFT DT in the emission period Te is expressed by the following Equation 1.

$$Ids = \frac{1}{2} * (\mu * C * W/L) * (Vgs - Vth)^2 \quad \text{[Equation 1]}$$

In Equation 1, μ represents an electron mobility. C represents a capacitance of a gate insulating layer. W represents a channel width of a driving TFT. L represents a channel length of a driving TFT. Vgs represents a gate-source voltage of a driving TFT, and Vth represents a threshold voltage of a driving TFT. Since the gate node-source node voltage Vgs of the driving TFT becomes "EVDD−Vdata+Vth" in the emission period Te, $(Vgs-Vth)^2$ in the above equation 1 becomes $(EVDD-Vdata)^2$.

Since the threshold voltage Vth factor is eliminated in Equation 1, the influence of the threshold voltage Vth of the driving TFT DT on the driving current of the OLED is eliminated.

Figure 11:
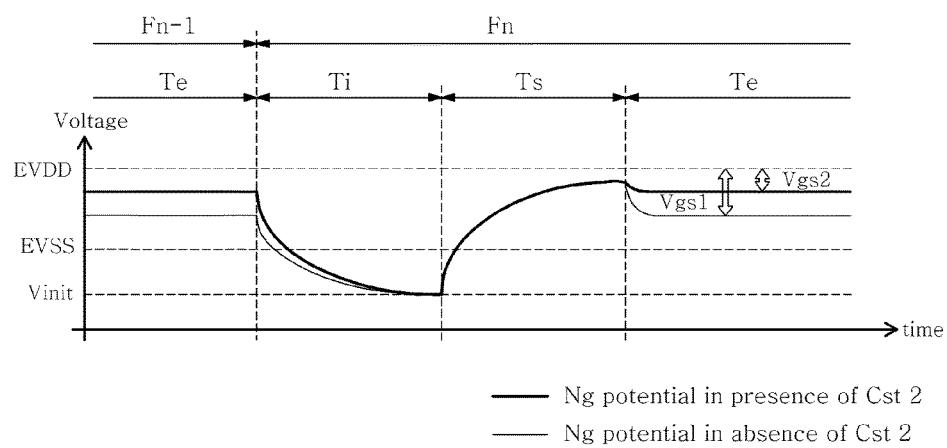
FIG. 11 is a waveform diagram illustrating a gate-source voltage of a driving TFT depending on presence or absence of a second capacitor in a pixel of FIG. 6.

FIG. 11 is a waveform diagram illustrating a gate-source voltage Vgs of a driving TFT DT depending on presence or absence of a second capacitor Cst2 in a pixel PXL of FIG. 6.

Referring to FIG. 11, the presence or absence of the second capacitor Cst2 does not affect compensation of the threshold voltage Vth of the driving TFT DT. In other words, the potential of the gate node Ng is initialized to the initializing voltage Vinit regardless of the presence or absence of the second capacitor Cst2 in the initializing period Ti. The potential of the gate node Ng is set to "Vdata−Vth" regardless of the presence or absence of the second capacitor Cst2 in the sampling period Ts.

The presence or absence of the second capacitor Cst2 affects the gate-source voltage Vgs in the emission period Te.

When the second capacitor Cst2 is absent, since the potential of the gate node Ng is greatly dropped by the effect of kickback, the gate-source voltage Vgs1, that is, a value obtained by subtracting the voltage of the gate node Ng from the high potential driving voltage EVDD is increased. Since a magnitude of the driving current and an amount of the emission are determined in proportion to the gate-source voltage Vgs1, when the gate-source voltage Vgs1 is large in a full black gray scale implementation, the black luminance increases and the contrast ratio deteriorates.

On the other hand, when the second capacitor Cst2 is present, since the effect of kickback can be relieved through the current first scan signal SC1(n) that rises to the high level H, the potential of the gate node Ng is decreased to a small extent, the gate-source voltage Vgs2, that is, a value obtained by subtracting the voltage of the gate node Ng from the high potential driving voltage EVDD is decreased. When the gate-source voltage Vgs2 is small in the full black gray scale implementation, the black luminance decreases and the contrast ratio is improved.

A capacitance of the second capacitor Cst2 may be designed to be smaller than a capacitance of the first capacitor Cst1. The larger the capacitance of the second capacitor Cst2, the greater the effect of preventing the effect of kickback. However, the potential of the gate node Ng may become unstable depending on the first scan signal SC1(n). Considering the degree of maintaining the image quality while reducing the effect of kickback, the second capacitor Cst2 can be designed to have a magnitude of about 5% of the capacitance of the first capacitor Cst1.

Figure 12:
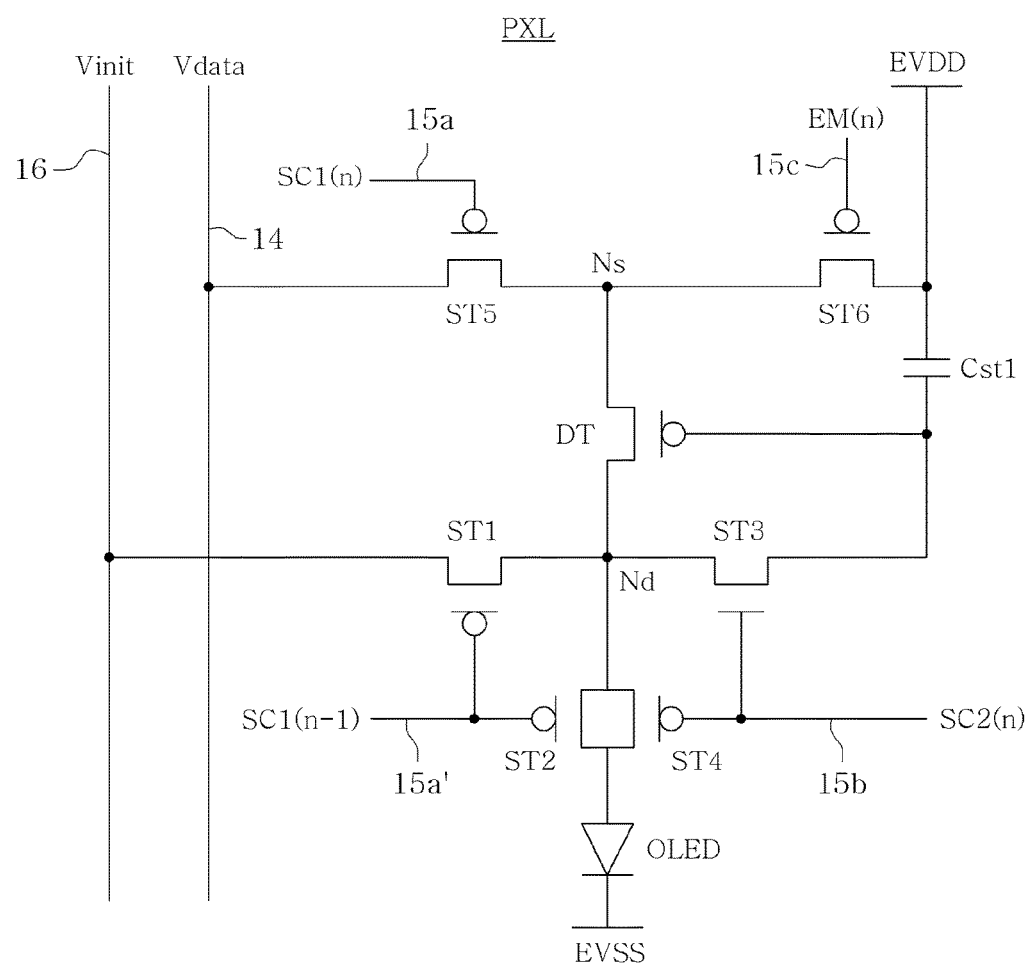
FIG. 12 illustrates another connection configuration of a pixel shown in FIG. 5.
Figure 13:
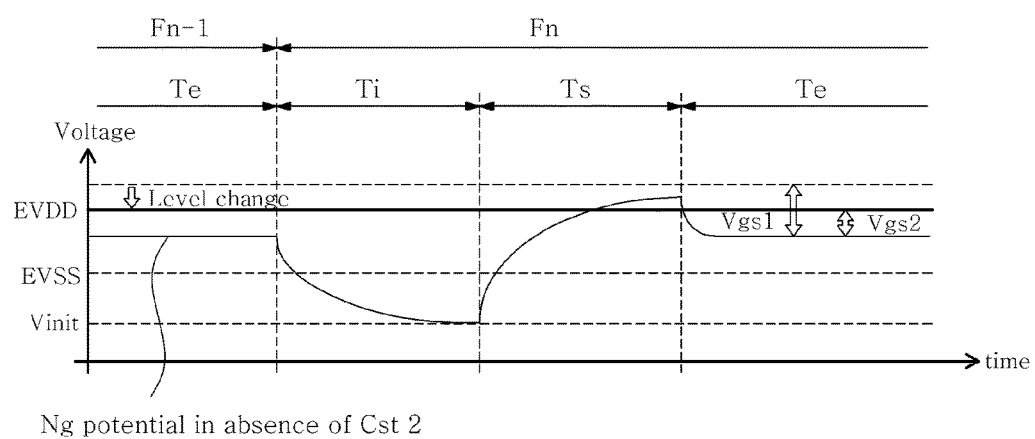
FIG. 13 is a waveform diagram illustrating a gate-source voltage of a driving TFT depending on whether or not a power supply voltage is adjusted in a pixel of FIG. 12.

FIG. 12 illustrates another connection configuration of a pixel PXL shown in FIG. 5. FIG. 13 illustrates a gate-source voltage of a driving TFT depending on whether or not a power supply voltage is adjusted in a pixel PXL of FIG. 12.

The pixel PXL shown in FIG. 12 is the same as the pixel PXL shown in FIG. 6 except that the second capacitor Cst2 is removed. The pixel PXL shown in FIG. 12 is driven by receiving the driving signals of FIG. 7, so that the OLED can emit light with a driving current irrespective of a threshold voltage Vth of a driving TFT DT.

However, since there is no second capacitor Cst2 in the pixel PXL of FIG. 12, there may be a problem that the aforementioned contrast ratio characteristic deteriorates. Thus, in a full black gray scale implementation, the disclosure sets a level of a high potential driving voltage EVDD to a low level so that a value obtained by subtracting a voltage of a gate node Ng from the high potential driving voltage EVDD during an emission period Te becomes smaller than the threshold voltage Vth of the driving TFT DT. When the level of the high potential driving voltage EVDD is thus set lower, a gate-source voltage Vgs2 is reduced compared to a gate-source voltage Vgs1 before the setting to be low. As a result, the black luminance is lowered and the contrast ratio can be improved. Although not shown in the drawings, the disclosure can set not only the high potential driving voltage EVDD but also a low potential driving voltage EVSS to be low so as to improve the contrast ratio.

As described above, in the disclosure, TFTs constituting the pixel are composed of an oxide TFT and a LTPS TFT, and an NMOS type and a PMOS type are suitably arranged to simplify TFT process steps and provide an organic light emitting display suitable for realizing a high resolution pixel implementation. Furthermore, the disclosure can minimize the problem of an increase in black luminance caused when the LTPS TFT is implemented as the PMOS type, by connecting the second capacitor to the gate node of the pixel, or by setting the high potential driving voltage to be low.

Furthermore, the present disclosure can reduce power consumption by electrically separating a supply path of a data voltage and an initialization voltage to reduce the number of transitions of a source driver.

An organic light emitting display according to an aspect of the present disclosure for generating such an effect includes a display panel 10 in which a plurality of pixels PXL are provided and each of the pixels PXL is connected to a data line 14 and an initialization voltage supply line 16. Here, each pixel PXL arranged on an n-th horizontal pixel line includes a driving TFT DT having a gate electrode, a drain electrode, and a source electrode connected to a gate node Ng, a drain node Nd, and a source node Ns, respectively, a first switching ST1 forming a current path between the initialization voltage supply line 16 and the drain node Nd depending on a previous first scan signal SC1(n-1) input to an (n-1)th horizontal pixel line, a second switching TFT ST2 forming a current path between the drain node Nd and an OLED depending on the previous first scan signal SC1(n-1), a third switching TFT ST3 forming a current path between the gate node Ng and the drain node Nd depending on a current second scan signal SC2(n) input to the n-th horizontal pixel line, a fourth switching TFT ST4 forming a current path between the drain node Nd and the OLED depending on the current second scan signal SC2(n), a fifth switching TFT ST5 forming a current path between the data line 14 and the source node Ns depending on a current first scan signal SC1(n) input to the n-th horizontal pixel line, a sixth switching TFT ST6 forming a current path between an input terminal of the high potential driving voltage EVDD and the source node Ns depending on a current emission signal EM(n) input to the n-th horizontal pixel line, and a first capacitor Cst1 connected between the gate node Ng and the input terminal of the high potential driving voltage EVDD, wherein the third switching TFT ST3 is implemented as an NMOS type TFT and the remaining TFTs DT, ST1 to ST2, ST4 to ST6 are implemented as a PMOS type TFT or a combination of the PMOS type TFT and the NMOS type TFT.

Each gate electrode of the first switching TFT ST1 and the second switching TFT ST2 is connected to a previous first gate line 15a' to which the previous first scan signal SC1 (n-1) is applied. Each gate electrode of the third switching TFT ST3 and the fourth switching TFT ST4 is connected to a current second gate line 15b to which the current second scan signal SC2(n) is applied. A gate electrode of the fifth switching TFT ST5 is connected to a current first gate line 15a to which the current first scan signal SC1(n) is applied. A gate electrode of the sixth switching TFT ST6 is connected to a current third gate line 15c to which the current emission signal EM(n) is applied.

In an initialization period Ti, the previous first scan signal SC1(n-1) is input at a low level L, and the current first scan signal SC1(n), the current second scan signal SC2(n), and the current emission signal EM(n) are input at a high level H. In a sampling period Ts after the initialization period Ti, the current first scan signal SC1(n) is input at the low level L, and the previous first scan signal SC1(n-1), the current second scan signal SC2(n), and the current emission signal EM(n) are input at the high level H. In an emission period Te after the sampling period Ts, the previous first scan signal SC1(n-1) and the current first scan signal SC1(n) are at the high level H, and the current second scan signal SC2(n) and the current emission signal EM(n) are input at the low level L.

Each pixel PXL arranged on the n-th horizontal pixel line further includes a second capacitor Cst2 connected between the current first gate line 15a to which the current first scan signal SC1(n) is applied and the gate node Ng.

A capacitance of the second capacitor Cst2 is designed to be smaller than a capacitance of the first capacitor Cst1.

In the full black gray scale implementation, the high potential driving voltage EVDD is set to be low so that a value obtained by subtracting the voltage of the gate node Ng from the high potential driving voltage EVDD becomes smaller than the threshold voltage Vth of the driving TFT DT during the emission period Te.

Also, as an organic light emitting display according to an aspect of the disclosure is an organic light emitting display having an organic light emitting element, the organic light emitting display includes a driving TFT for applying a driving current to the organic light emitting element to emit the organic light emitting element, a plurality of switching TFTs involved in turn-on of the driving TFT, and a first capacitor connected to a gate electrode of the driving TFT and storing a turn-on voltage of the driving TFT. Among the switching TFTs, at least one TFT is implemented as an NMOS type TFT, and the remaining TFTs are implemented as a PMOS type TFT or a combination of the PMOS type TFT and the NMOS type TFT.

The switching TFTs include a third switching TFT ST3 connected between the gate electrode and a drain electrode of the driving TFT, and a fifth switching TFT ST5 connected to a source electrode of the driving TFT. The third switching TFT ST3 and the fifth switching TFT ST5 are selectively implemented differently from the NMOS type TFT and the PMOS type TFT.

The gate electrode of the fifth switching TFT ST5 is connected to the first gate line 15a to which the first scan signal SC1(n) is supplied. The gate electrode of the third switching TFT ST3 is connected to the second gate line 15b to which the second scan signal SC2(n) is supplied. The first scan signal SC1(n) and the second scan signal SC2(n) are input at an off-level of reverse phase each other in the emission period in which the driving current flows to the driving TFT. A second capacitor Cst2 is connected between the gate electrode of the driving TFT and the first gate line 15a to minimize the effect of kickback due to turn-off of the third switching TFT ST3.

A capacitance of the second capacitor Cst2 is designed to be smaller than a capacitance of the first capacitor Cst1.

In the full black gray scale implementation, the high potential driving voltage EVDD is set to be low so that the gate-source voltage of the driving TFT becomes smaller than a threshold voltage of the driving TFT during the emission period in which the driving current flows to the driving TFT.

As described above, in the disclosure, TFTs constituting the pixel are composed of an oxide TFT and an LTPS TFT, and an NMOS type and a PMOS type are suitably arranged to simplify TFT process steps and provide an organic light emitting display suitable for realizing a high resolution pixel implementation.

Furthermore, the present disclosure can minimize the problem of an increase in black luminance caused when the LTPS TFT is implemented as the PMOS type, by connecting the second capacitor to the gate node of the pixel, or by setting the high potential driving voltage to be low.

Furthermore, the present disclosure can reduce power consumption by electrically separating a supply path of a data voltage and an initialization voltage to reduce the number of transitions of a source driver.

The effects according to the disclosure are not limited by the contents exemplified above, and a more various effects are included in the specification.

Although aspects of the present disclosure have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display comprising a plurality of pixels on a display panel, each pixel connected to a data line and an initialization voltage supply line and arranged on an n-th horizontal pixel line, comprising:
    a driving TFT having a gate electrode, a drain electrode, and a source electrode connected to a gate node, a drain node, and a source node, respectively;
    a first switching TFT forming a current path between the initialization voltage supply line and the drain node depending on a previous first scan signal input to an (n−1)-th horizontal pixel line;
    a second switching TFT forming a current path between the drain node and an organic light emitting diode (OLED) depending on the previous first scan signal;
    a third switching TFT forming a current path between the gate node and the drain node depending on a current second scan signal input to the n-th horizontal pixel line;
    a fourth switching TFT forming a current path between the drain node and the OLED depending on the current second scan signal;
    a fifth switching TFT forming a current path between the data line and the source node depending on a current first scan signal input to the n-th horizontal pixel line;
    a sixth switching TFT forming a current path between an input terminal of a high potential driving voltage and the source node depending on a current emission signal input to the n-th horizontal pixel line; and
    a first capacitor connected between the gate node and the input terminal of the high potential driving voltage,
    wherein the third switching TFT includes an NMOS type TFT, and remaining TFTs except for the third switching TFT include a PMOS type TFT or a combination of the PMOS type TFT and the NMOS type TFT.

2. The organic light emitting display of claim 1, wherein the first switching TFT and the second switching TFT each having a gate electrode connected to a previous first gate line to which the previous first scan signal is applied,
    each gate electrode of the third switching TFT and the fourth switching TFT is connected to a current second gate line to which the current second scan signal is applied,
    a gate electrode of the fifth switching TFT is connected to a current first gate line to which the current first scan signal is applied, and
    a gate electrode of the sixth switching TFT is connected to a current third gate line to which the current emission signal is applied.

3. The organic light emitting display of claim 1, wherein in an initialization period, the previous first scan signal is input at a low level, and the current first scan signal, the current second scan signal, and the current emission signal are input at a high level,
    in a sampling period after the initialization period, the current first scan signal is input at the low level, and the previous first scan signal, the current second scan signal, and the current emission signal are input at the high level, and
    in an emission period after the sampling period, the previous first scan signal and the current first scan signal are at the high level, and the current second scan signal and the current emission signal are input at the low level.

4. The organic light emitting display of claim 1, further comprising a second capacitor connected between the current first gate line to which the current first scan signal is applied and the gate node.

5. The organic light emitting display of claim 4, wherein the second capacitor has a capacitance smaller than a capacitance of the first capacitor.

6. The organic light emitting display of claim 3, wherein in a full black gray scale implementation, the high potential driving voltage is set to be low so that a value obtained by subtracting a voltage of the gate node from the high potential driving voltage becomes smaller than a threshold voltage of the driving TFT during the emission period.

7. The organic light emitting display of claim 1, wherein the third switching TFT includes an NMOS type oxide TFT.

8. The organic light emitting display of claim 1, wherein the remaining TFTs include a PMOS type low temperature polysilicon (LTPS) TFT or a combination of the PMOS type LTPS TFT and an NMOS type LTPS TFT.

9. An organic light emitting display having an organic light emitting element, comprising:
    a driving TFT configured to apply a driving current to the organic light emitting element to emit the organic light emitting element;

a plurality of switching TFTs switching the driving TFT between turn-on and turn-off states; and a first capacitor connected to the driving TFT and storing a turn-on voltage of the driving TFT, wherein at least one of the plurality of switching TFTs includes an NMOS type TFT;

wherein the plurality of switching TFTs comprises a third switching TFT connected between the gate electrode and a drain electrode of the driving TFT, and a fifth switching TFT connected to a source electrode of the driving TFT, and wherein the third switching TFT and the fifth switching TFT are one of the NMOS type TFT and the PMOS type TFT respectively and are different types from each other;

wherein the fifth switching TFT has a gate electrode connected to a first gate line where a first scan signal is supplied, and the third switching TFT has a gate electrode connected to a second gate line where a second scan signal is supplied, wherein the first scan signal and the second scan signal are input at an off-level of reverse phase from each other during an emission period in which the driving current flows to the driving TFT.

10. The organic light emitting display of claim 9, wherein remaining switching TFTs other than the at least one of the plurality of switching TFTs and the driving TFTs include a PMOS type TFT or a combination of the PMOS type TFT and the NMOS type TFT.

11. The organic light emitting display of claim 10, wherein the PMOS type TFT and the NMOS type TFT include a low temperature polysilicon (LTPS) TFT.

12. The organic light emitting display of claim 9, further comprising a second capacitor connected between the gate electrode of the driving TFT and the first gate line to minimize a kickback effect caused by turning off the third switching TFT.

13. The organic light emitting display of claim 12, wherein the second capacitor has a capacitance smaller than a capacitance of the first capacitor.

14. The organic light emitting display of claim 9, wherein in a full black grayscale implementation, a high potential driving voltage is set to be low so that a gate-source voltage of the driving TFT becomes smaller than a threshold voltage of the driving TFT during an emission period in which the driving current flows to the driving TFT.

15. The organic light emitting display of claim 9, wherein the plurality of switching TFTs further comprising:

a first switching TFT having a gate electrode is connected to a previous first gate line to which a previous first scan signal is applied, a source electrode connected to an initialization voltage supply line, and a drain electrode connected to a drain node; and a second switching TFT having a gate electrode connected to the previous first gate line to which the previous first scan signal is applied, a source electrode connected to the drain node, and a drain electrode connected to an anode electrode of the organic light emitting display.

16. The organic light emitting display of claim 15, wherein the plurality of switching TFTs further comprising:

a fourth switching TFT having a gate electrode connected to a current second gate line to which a current second scan signal is applied, a source electrode connected to the drain node, and a drain electrode connected to the anode electrode of organic light emitting display; and a sixth switching TFT having a gate electrode connected to a current third gate line to which a current emission signal is applied, a source electrode connected to an input terminal of a high potential driving voltage supply line, and a drain electrode connected to a source node.

* * * * *